United States Patent
Boldt

(10) Patent No.: US 7,281,184 B2
(45) Date of Patent: Oct. 9, 2007

(54) TEST SYSTEM AND METHOD FOR TESTING A CIRCUIT

(75) Inventor: Sven Boldt, Aschheim (DE)

(73) Assignee: Infineon Technologies AG, Munich (DE)

( * ) Notice: Subject to any disclaimer, the term of this patent is extended or adjusted under 35 U.S.C. 154(b) by 103 days.

(21) Appl. No.: 11/215,389

(22) Filed: Aug. 30, 2005

(65) Prior Publication Data

US 2006/0048032 A1    Mar. 2, 2006

(30) Foreign Application Priority Data

Aug. 31, 2004 (DE) ............... 10 2004 042 072

(51) Int. Cl.
*G01R 31/28* (2006.01)
*G06F 11/00* (2006.01)

(52) U.S. Cl. ............... 714/736; 714/703; 714/742; 714/733

(58) Field of Classification Search ............... None
See application file for complete search history.

(56) References Cited

U.S. PATENT DOCUMENTS

| 4,092,589 | A | 5/1978 | Chau et al. |
| 4,497,056 | A | 1/1985 | Sugamori |
| 4,542,505 | A | 9/1985 | Binoeder et al. |
| 6,556,037 | B2* | 4/2003 | Shiraishi ............... 324/765 |
| 6,753,693 | B2* | 6/2004 | Seo et al. ............... 324/765 |
| 7,079,612 | B2* | 7/2006 | Tarng ............... 375/354 |

* cited by examiner

*Primary Examiner*—Phung My Chung
(74) *Attorney, Agent, or Firm*—Jenkins, Wilson, Taylor & Hunt, P.A.

(57) ABSTRACT

A test-device for testing an electric circuit comprises a data stream generator for generating a first data stream to be fed to an electric circuit which generates a second data stream in response to the first data stream and a comparison-device for comparing two data streams. The test-device comprises further a self-test device configured to generate a third data stream used to test the comparison-device. The test-device is further configured to operate in a first operation mode and in a second operation mode. The comparison-device is configured to compare the first data stream with the second data stream during the first operation mode and is configured to compare the first data stream with the third data stream during the second operation mode.

12 Claims, 2 Drawing Sheets

TEST SYSTEM AND METHOD FOR TESTING A CIRCUIT

BACKGROUND OF THE INVENTION

1. Field of the Invention

The invention relates to a test system and a method for testing a electric circuit.

In particular, the present invention relates to a test system for memory devices, in particular for DRAM units (DRAM=Dynamic Random Access Memory) using special test modes TM.

The present invention relates specifically to a test device for testing a circuit unit to be tested comprising a desired data stream generating device for providing a desired data stream that is fed to the circuit unit to be tested, a comparison device for comparing the desired data stream fed to the circuit unit to be tested, said desired data stream being fed to a reference terminal of the comparison device, with an actual data stream which is output from the circuit unit to be tested in a manner dependent on the desired data stream fed thereto and is fed to a test terminal of the comparison device, and the comparison device providing a corresponding comparison result, and an output unit for outputting the comparison result provided by means of the comparison device.

2. Description of the Prior Art

FIG. 3 shows a simplified block diagram of a conventional test device for testing a circuit unit DUT (Device Under Test) to be tested. In a manner dependent on a desired data stream (not shown) fed to the circuit unit DUT to be tested, an actual data stream ID is fed from the circuit unit DUT to be tested to a test terminal p of a comparison device VE. The comparison device furthermore receives a desired data stream SD via its reference terminal r.

The desired data stream SD is read out from a register R and adapted in a data scrambler S. The register has an input terminal E, via which a test data stream T can be fed to the register R and be stored therein. A comparison result v is obtained via an output terminal A, said comparison result enabling a statement as to whether the actual data stream fed to the test terminal p corresponds to the desired data stream SD that was fed to the reference terminal r of the comparison device VE.

In this case, it is necessary for the desired data stream SD and the actual data stream ID to be compared with one another bit by bit. A functionality of the circuit unit DUT to be tested is assumed only when the actual data stream ID completely matches the desired data stream SD.

The test costs when testing circuit units to be tested decrease as the number of circuit units that can be tested in a specific time increases, that is to say as the throughput rate increases. In order to reduce a test time and thus to save test costs, it is possible, then, either to decrease the test times or to increase the number of circuit units to be tested that can be tested in parallel per test system.

One specific test mode is the ACTM (Advanced Compression Test Mode), which enables particularly fast testing of the circuit units to be tested. In this case, the test data from which the desired data stream is obtained are stored in the register R, it being possible for the register R to be contained on the circuit unit DUT to be tested (not shown in FIG. 3). The data read out from the register R are then applied to an internal data bus and—if the circuit unit DUT to be tested is a memory device—written to the memory cells of the circuit unit DUT to be tested. When the corresponding memory information items are read out from the memory cells of the circuit unit to be tested, the data on the data bus are then compared with the desired data stream SD read out from the register R.

In order to check the functionality of the circuit unit DUT to be tested, it suffices for the comparison device VE to provide, as a comparison result v, an erroneous signal or an error-free signal ("pass"/"fail" result) at an output terminal A. Conventionally, an erroneous signal is represented by a logic "1" (high level) while an error-free signal is represented by a logic "0" (low level).

It is disadvantageous that with the conventional test device it is not possible to determine whether the comparison device can correctly identify all bit combinations that arise between the desired data stream SD and the actual data stream ID and are to be compared with one another. In an inexpedient manner, there is the possibility of a specific bit combination supplying an error-free signal ("pass" result) even though the data topology with regard to the desired data stream SD and the actual data stream ID were not identical.

In an unfavorable case, that is to say if an incorrect error-free signal ("pass" signal) is output to the output terminal A of the comparison device VE, a defective circuit unit to be tested would be regarded as error-free and be shipped.

SUMMARY OF THE INVENTION

It is an object of the present invention to provide a test device and test method by means of which a circuit unit to be tested can be tested effectively and reliably.

The object is achieved in accordance with the invention by means of a test device for testing a circuit unit, comprising:

a desired data stream generating device for providing a desired data stream that is fed to the circuit unit to be tested; a comparison device for comparing the desired data stream fed to the circuit unit to be tested, said desired data stream being fed to a reference terminal of the comparison device, with an actual data stream which is output from the circuit unit to be tested in a manner dependent on the desired data stream fed thereto and is fed to a test terminal of the comparison device, and for providing a corresponding comparison result; and an output unit for outputting the comparison result provided by means of the comparison device, provision being made of a self-test device for generating a self-test data stream, by means of which the comparison device can be tested, and a changeover device for changing over between a self-test mode, in which the self-test data stream is fed to the test terminal of the comparison device, and a normal mode, in which the actual data stream is fed to the test terminal of the comparison device.

The object is also achieved in accordance with the invention by means of a method for testing a circuit unit to be tested essentially has the following steps of:

generating a desired data stream by means of a desired data stream generating device;

feeding the desired data stream generated to the circuit unit to be tested;

comparing, by means of a comparison device, the desired data stream fed to the circuit unit to be tested, said desired data stream being fed to a reference terminal of the comparison device, with an actual data stream, which is output from the circuit unit to be tested in a manner dependent on the desired data stream fed thereto and is fed to a test terminal of the comparison device, in order to obtain a corresponding comparison result; and outputting the comparison result provided by the comparison device by means of an output unit, a self-test data stream, by means of which the comparison device can be tested, being generated by means of a self-test device and a changeover being made changing over from a normal mode, in which the actual data stream is fed to the test terminal of the comparison device, to a self-test mode, in which the self-test data stream is fed to the test terminal of the comparison device, by means of a changeover unit.

In the self-test mode, the method involves determining whether the comparison device is functional, the comparison result output by the comparison device and by means of the output unit being used for assessing the functionality of the circuit unit to be tested only when the functionality of the comparison device has been verified previously.

The invention provides a self-test of the test device for testing circuit units to be tested, which makes it possible to check the functionality of a comparison device present in the test device. The essential concept of the invention consists in using the self-test device for generating a self-test data stream, by means of which the comparison device of the test device can be tested, a changeover unit for changing over between a self-test mode, in which the self-test data stream is fed to the test terminal of the comparison device, and a normal mode, in which the actual data stream read out from the circuit unit to be tested is fed to the test terminal of the comparison device.

An essential advantage of the test device according to the invention and of the test method according to the invention consists in the fact that the functionality of the comparison device arranged in the test system can be verified exactly. Furthermore, it is possible to carry out the verification in different speed ranges (data throughput rates) in order to identify speed-dependent errors of the test device.

In accordance with one preferred development of the present invention, the desired data stream and/or the actual data stream and/or the self-test data stream have a width of 4 bits.

In accordance with a further preferred development of the present invention, the comparison result has a width of 1 bit, in such a way that preferably an erroneous signal is represented by a high level and an error-free signal is represented by a low level and output.

In accordance with yet another preferred development of the present invention, provision is made of a transmission device for transmitting the actual data stream from the circuit unit to be tested to the comparison device.

In accordance with yet another preferred development of the present invention, a gate unit is provided, which blocks feeding of the desired data stream to the reference terminal of the comparison device when the desired data stream matches the self-test data stream in the case where the self-test mode has been set by the changeover device.

In accordance with yet another preferred development of the present invention, the desired data stream generating device has a data adapting unit for providing a desired data stream adapted to the circuit unit to be tested.

In accordance with yet another preferred development of the present invention, the functionality of the comparison device is checked at different data rates.

The self-test device according to the invention makes it possible to reliably check the functionality of the comparison device of the test device in such a way that a reliable test of circuit units to be tested is ensured.

DESCRIPTION OF THE PREFERRED EMBODIMENTS

In the Figures, identical reference symbols designate identical or functionally identical components or steps.

Figure 1:
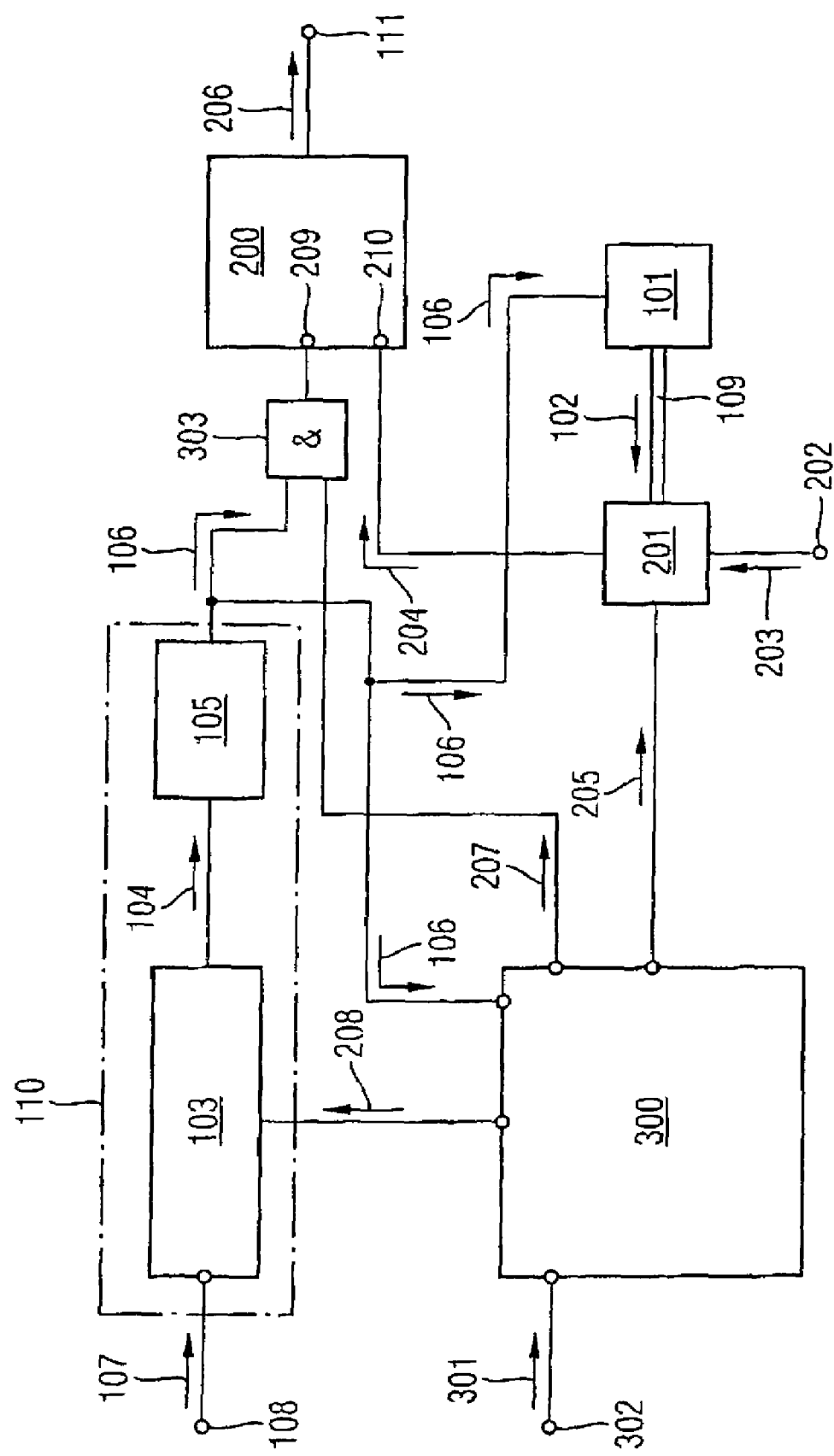
FIG. 1 is a block diagram of a test device, comprising a self-test device, in accordance with a preferred exemplary embodiment of the present invention.

FIG. 1 shows a block diagram of a test device, having a self-test device 300, in accordance with a preferred exemplary embodiment of the present invention. The function of the test device for testing a circuit unit 101 to be tested will firstly be described with reference to FIG. 1. Afterward, the functioning of the self-test device 300 will be described with reference to FIG. 2.

As shown in FIG. 1, from a test system (not shown) a test data stream 107 is input into the test device via a test data input terminal 108. The test data stream 107 is first of all fed to a desired data stream generating device 110 for generating a desired data stream 106. The desired data stream 106 is fed to a comparison device 200, the circuit unit 101 to be tested and the self-test device 300. In accordance with the preferred exemplary embodiment of the present invention, the desired data stream generating device has a register unit 103 and a data adapting unit 105. It should be pointed out that the desired data stream generating device may be arranged on the circuit unit 101 to be tested itself even though this is not shown as such in the exemplary embodiment of the present invention explained with reference to FIG. 1. The test data fed as a test data stream are stored or buffer-stored in the register unit 103.

In the case of an ACTM test (ACTM=Advanced Compression Test Mode), bit combinations stored in the register unit 103 are used for generating the desired data stream 106. Bit combinations of this type are also referred to as a "data topology" that is intended to be written to the circuit unit 101 to be tested. The circuit 101 to be tested is a Dynamic Random Access Memory (DRAM), for example, the data topology then being written to the memory cell array of the DRAM. In order to adapt the data topology to the cell array, a data adapting unit 105 is provided, by means of which the data can be adapted to an actual configuration of the cell array in a manner dependent on the address.

The data thus adapted are obtained as the desired data stream 106 from the data adapting unit 105 in a manner dependent on the register output data stream 104 of the register unit 103 fed to the data adapting unit 105. The desired data stream 106 obtained is fed to a reference terminal of a comparison device 200 via a gate unit 303. The comparison device represents the central unit of the test system, to the effect that the desired data stream 106 is compared with an actual data stream 102, which is obtained from the circuit unit 101 to be tested, in said comparison device. In this case, the actual data stream is fed to a test terminal 210 of the comparison device 200. The comparison result 206 output from the comparison device 200 via an output unit supplies a statement about whether the actual data stream 102 matches the desired data stream 106. In accordance with the preferred embodiment of the present invention, the comparison device 200 is formed as an XOR (exclusive-OR) gate.

In a bit-by-bit comparison of the desired data stream 106 with the actual data stream 102, a comparison result is output as a logic "1" when corresponding bits of the desired data stream 106 do not match those of the actual data stream 102, while a logic "0" is output as the comparison result in the event of matching. Consequently, by means of the XOR gate provided in the preferred embodiment of the present invention, in the case where the actual data stream 102 does not match the desired data stream 106, an erroneous signal is output as a logic "1", which indicates to the user that the circuit unit 101 to be tested has an error. In the event of matching between the actual data stream 102 and the desired data stream 106, by contrast, an error-free signal is output as a logic "0" in order to indicate to the user that the circuit unit 101 to be tested functions in a manner free of errors for the currently tested bit combination.

As mentioned above, however, with conventional test devices it is not possible to check whether the comparison device 200 itself has operated correctly. In particular, it is extremely disadvantageous if the comparison device 200 has an error to the effect that, when the desired data stream 106 and the actual data stream 102 do not match for a specific bit, the comparison device 200 nevertheless outputs a logic "0" signal, that is to say indicates error-free operation of the circuit unit 101 to be tested for this specific bit.

Figure 2:
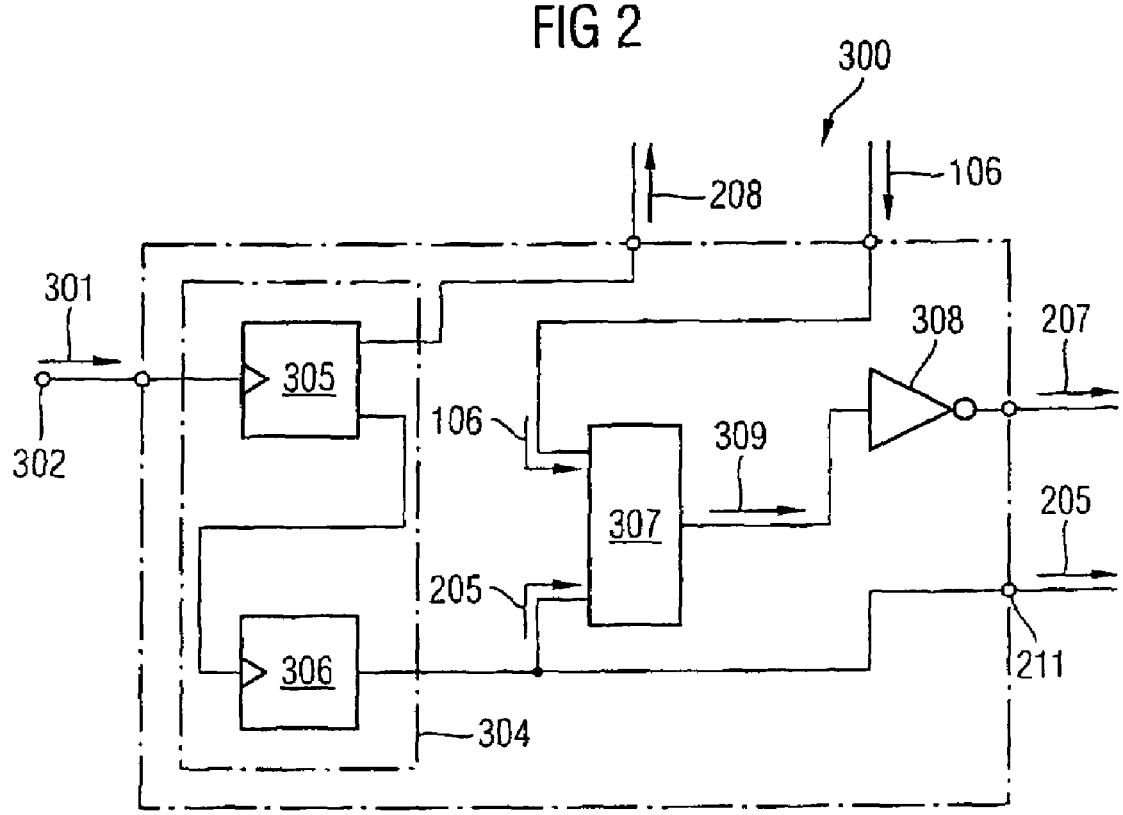
FIG. 2 shows the self-test device illustrated in FIG. 1 in greater detail.
Figure 3:
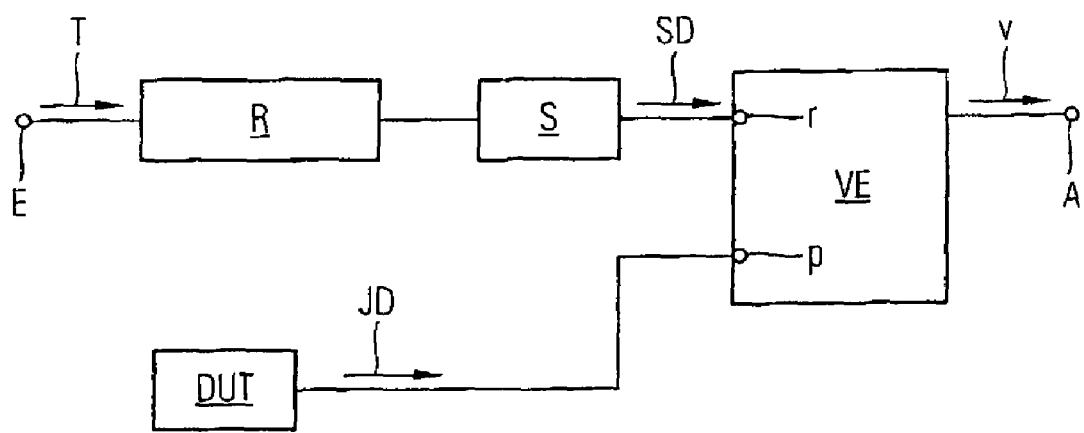
FIG. 3, as discussed above, is a test device according to prior art.

In order to eliminate this substantial disadvantage, the self-test device 300 described below with reference to FIG. 2 is provided according to the invention.

The remaining components of the test system will be described below with reference to FIG. 1. For testing the circuit unit 101 to be tested, the latter has to be fed the desired data stream 106 from the desired data stream generating device 110. The circuit unit 101 to be tested outputs the actual data stream 102 in a manner dependent on the desired data stream 106 fed thereto.

For this purpose, the circuit unit to be tested is connected to a changeover unit 201 via a transmission device 109. A test mode signal 203 is fed to the changeover unit 201 via a test mode terminal unit 202, which signal controls the changeover operation of the changeover unit 201. In order to achieve the object according to the invention, that is to say in order to provide a self-test of the test device, the comparison device 200 has to be tested with a specifically prescribed self-test data stream 205. For this purpose, a changeover between a normal mode, that is to say a mode in which the circuit unit 101 to be tested is tested, and a self-test mode is provided by the changeover unit 201 in a manner dependent on the test mode signal 203 fed thereto. In the normal mode, the actual data stream 102 is fed via the changeover unit 201 to the test terminal 210 of the comparison device 200 as the data stream 204 to be tested.

On the other hand, in the self-test mode, the self-test data stream 205 output from the self-test device 300 is fed via the changeover unit 201 to the test terminal 210 of the comparison device 200 as the data stream 204 to be tested.

The gate unit 303, which controls a transfer of the desired data stream 106 from the desired data stream generating device 110 to the comparison device 200, is driven by a gate switching signal 207 output by the self-test device 300. The way in which the gate signal 207 for switching the gate unit 303 on or off is generated in the self-test device 300 will be described below with reference to FIG. 2.

In order to generate the self-test data stream 205, the self-test device 300 is fed both the desired data stream 106 and a trigger signal 301 via a trigger input terminal 302. A register switching signal 208 for driving the register unit 103 provided in the desired data stream generating device 110 is furthermore output from the self-test device 300.

The communication between the self-test device 300 and the register unit 103 serves the purpose that, in addition to a bit sequence (bit combination) that is prescribed by the test data stream 107 and is used in the normal mode, arbitrary bit combinations can be fed to the register unit 103 in order to reliably and comprehensively test the comparison device 200 in the self-test mode.

FIG. 2 shows the self-test device 300 illustrated in FIG. 1 in greater detail. It should be pointed out that identical reference symbols denote identical components, an overlapping description of the corresponding components that are present in both figures being omitted.

The self-test device 300 has a counting device 304, which comprises a first counting unit 305 and second counting unit 306 in the preferred exemplary embodiment of the present invention. The first and second counting units 305, 306 are connected in series in a cascaded manner and form a serial counter.

The operation of the self-test device 300 will be explained in detail below. Upon a start of a generation of the self-test data stream 205 by the self-test device 300, firstly a trigger signal 301 is input via the trigger input terminal 302, which trigger signal passes to the clock input of the first counter unit 305. Consequently, the first counter unit is counted, an output signal of the first counter unit 305 being provided as the register switching signal 208 for the register 103 of the desired data stream generating device 110 (FIG. 1).

The carry as second output signal of the first counter unit 305 is fed to a clock terminal of the second counter unit 306. As a result of the counting up of the first and second counter units, arbitrary bit combinations are provided at the output of the second counter unit 306, these combinations forming the self-test data stream 205. The self-test data stream 205 is fed via a self-test output unit 211 to the changeover unit 201 (FIG. 1).

With regard to the circuit arrangement illustrated in FIG. 1, it should be pointed out that it is assumed in the description of the self-test mode that the changeover unit 201 is switched by the test mode signal 203 in such a way that the self-test data stream 205 output by the self-test device 300 is fed as the data stream 204 to be tested to the test terminal 210 of the comparison device 200. Consequently, in the self-test mode, the self-test output unit 211 of the self-test device 300 and the test terminal 210 of the comparison device 200 (FIG. 1) are connected to one another.

The self-test data stream 205 output from the second counter unit 306 of the counter device 304 is furthermore fed to an internal comparison unit 307 within the self-test device 300, which internal comparison unit compares the self-test data stream 205 with the desired data stream 106 fed to the self-test device 300. The comparison of the self-test data stream 205 with the desired data stream 106 serves for providing a determination signal 309 for determining matching of the self-test data stream 205 to the desired data stream 106.

In the preferred exemplary embodiment of the present invention, the internal comparison unit 307 is formed as an XOR gate (exclusive-OR gate). In this case, the self-test data stream 205 serves for testing the comparison device 200 to the effect of ensuring that, in the case where the actual data stream 102 output from the circuit unit 101 to be tested does not match the desired data stream 106, the comparison device 200 under no circumstances outputs an error-free signal as the comparison result 206 to the output unit 111, that is to say that in the arrangement in accordance with the preferred exemplary embodiment of the present invention, the comparison result 206 is not permitted to output a logic "0" which would incorrectly indicate an error-free function of the circuit unit 101 to be tested.

In the case of the test method according to the invention, the comparison device 200 is then fed, in the self-test mode, the desired data stream 106 and the self-test data stream 205 for comparison, to be precise only when these differ in terms of the current bit combination. In this case, the invention affords the advantage that it is possible to provide arbitrary bit combinations for an efficient testing of the comparison device 200.

If, during a self-test of this type, a comparison result 206 arises which is represented by a logic "0", then it can be assumed that the comparison device 200 has an error for a bit combination of this type. In this way, it is furthermore ensured that no defective circuit unit 101 to be tested is shipped.

It should be pointed out that, in the preferred exemplary embodiment of the present invention, both the desired data stream 106 and the self-test data stream 205 are designed as 4-bit-wide data streams. However, the present invention is not restricted to 4-bit-wide data streams, rather an arbitrary bit width may be used. The comparison result 206 preferably comprises a 1-bit-wide data stream.

The functioning of the gate unit 303 will be explained in more detail below. In the preferred exemplary embodiment of the present invention, the gate unit 303 is formed as an AND gate. That is to say that when the gate switching signal 207 is provided as a logic "1", then the gate unit transfers the desired data stream 106 from the desired data stream generating device 110 to the reference terminal 209 of the comparison device 200. Blocking of such a transfer is provided when the gate switching signal 207 is provided as a logic "0".

Such blocking of the transfer of the desired data stream 106 to the comparison device 200 is necessary when the desired data stream 206 matches the self-test data stream 205. In such a case, the comparison device 200, in the event of error-free operation thereof, would supply a logic "0" as output signal, that is to say as comparison result 206. However, this output signal in the form of the logic "0" serves precisely for indicating an erroneous function of the comparison device 200 (see above).

Consequently, the blocking of the desired data stream 106 by the gate unit 303 ensures that the comparison result 206 output from the comparison device 200, in the self-test mode, indicates a logic "0" only when the comparison device 200 has an erroneous function. In this way, it is possible, with high accuracy and efficiency for a high number of bit combinations with a short self-test time, to provide a self-test for the test device. This advantageously has the effect that a test of a circuit unit 101 to be tested does not lead to errors caused by the test system in a normal mode.

In other words, in a test in the normal mode, a defective circuit 101 cannot lead to a comparison result 206 having a logic "0". In order that the gate switching signal 207 has a logic "1" each time when the self-test data stream 205 matches the desired data stream 206 for a specific bit, the determination signal 309 output from the comparison unit 307 must be inverted by means of an inverter unit 308 present in the self-test device 300. Consequently, the self-test device 300 according to the invention makes it possible to check the comparison function during a test of a circuit unit 101 to be tested.

A comparison function of this type is used by the comparison device 200 for example in the context of the ACTM (Advanced Compression Test Mode). In this case, the test method according to the invention has the advantage, in particular, that a comparison result output from the comparison device 200 is used for assessing the functionality of the circuit unit 101 to be tested only when the fact that the comparison device 200 is functional has been determined in the self-test mode.

In this case, the test method according to the invention enables the functionality of the comparison device 200 to be checked at different data rates. The maximum data rate limits the area of use and therefore represents a limiting factor when testing the circuit unit to be tested. The result as to the data rate (speed) up to which the ACTM is still functional thus at the same time corresponds to the maximum speed at which the circuit unit 101 to be tested is still to be considered as completely functional. A result of such a test can be stored, according to the invention, in an additional internal register.

Although modifications and changes may be suggested by those skilled in the art, it is the intention of the inventor to embody within the patent warranted heron all changes and modifications as reasonably and properly come within the scope of his contribution to the art.

I claim as my invention:

1. A test-device for testing an electric circuit, comprising:
    a data stream generator for generating a first data stream to be fed to an electric circuit which generates a second data stream in response to said first data stream;
    a comparison-device which is configured to compare a first data stream and a second data stream and to generate a corresponding signal;
    an output-device configured to output said signal;
    a self-test device configured to generate a third data stream which is used to test said comparison-device; and
    a gate which blocks feeding said first data stream to said comparison-device, if said first data stream matches said third data stream;
    said test-device being configured to operate in a first operation mode and in a second operation mode, wherein said comparison-device compares said first data stream with said second data stream during said first operation mode and compares said first data stream with said third data stream during said second operation mode.

2. The test-device of claim 1, comprising a switching-device configured to switch said test-device between said first operation mode and said second operation mode.

3. The test-device of claim 1, wherein at least one of said first, second, and third data streams has a width of four bits.

4. The test-device of claim 1, wherein said signal is output as a one-bit-wide erroneous signal or error-free signal.

5. The test-device of claim 1, comprising a transmission-device configured to transmit said second data stream from said electric circuit to said comparison-device.

6. The test-device of claim 1, wherein said data stream generator is configured to adapt said first data stream in accordance to said electric circuit.

7. A method for testing an electric circuit, comprising the steps of:
    generating a first data stream with a data stream generator;

feeding the first data stream to an electric circuit which generates a second data stream in response to said first data stream;
comparing said first data stream with said second data stream using a comparison-device during a first operation mode;
obtaining a signal based on said comparison of said first data stream with said second data stream;
outputting said signal using an output-device;
generating a third data stream using a self-test device during a second operation mode;
comparing said first data stream with said third data stream using said comparison-device;
checking if said first data stream matches said third data stream;
blocking feeding said first data stream if said first data stream matches said third data stream using a gate;
determining if the comparison-device is functional during said second operation mode due to said comparison of said first data stream with said third data stream; and
outputting said signal using said output-device only, if it is determined that said comparison-device is functional during said second operation mode.

8. The method of claim 7, comprising switching between said first operation mode and said second operation mode using a switching-device.

9. The method of claim 7, wherein said signal is output as a one-bit-wide erroneous signal or error-free signal.

10. The method of claim 7, comprising transmitting said second data stream from said electric circuit to said comparison-device by means of a transmission-device.

11. The method of claim 7, comprising adapting said first data stream to said electric circuit.

12. The method of claim 7, comprising determining if said comparison-device is functional during said second operation mode using different data rates.

* * * * *